United States Patent [19]
Gindi et al.

[11] 3,986,126
[45] Oct. 12, 1976

[54] SERIAL PULSE-CODE-MODULATED RETIMING SYSTEM

[75] Inventors: Abraham M. Gindi, San Jose, Calif.; Ju-Hi J. Hong; William K. Stelzenmuller, both of Poughkeepsie, N.Y.

[73] Assignee: International Business Machines Corporation, Armonk, N.Y.

[22] Filed: May 15, 1975

[21] Appl. No.: 577,570

[52] U.S. Cl. ............................ 328/63; 178/69.5 R; 307/208; 307/269
[51] Int. Cl.² ...................... H03K 1/17; H04L 7/00
[58] Field of Search .............. 307/208, 269; 328/63; 178/69.5 R; 179/15 BS

[56] References Cited
UNITED STATES PATENTS

| | | | |
|---|---|---|---|
| 3,440,548 | 4/1969 | Saltzberg | 328/63 |
| 3,602,828 | 8/1971 | Kurzweil, Jr. et al. | 328/63 |
| 3,646,269 | 2/1972 | Fudemoto et al. | 178/69.5 R |
| 3,916,084 | 10/1975 | Toole | 178/69.5 R |

*Primary Examiner*—Stanley D. Miller, Jr.
*Attorney, Agent, or Firm*—Harold H. Sweeney, Jr.

[57] ABSTRACT

An improved clock retiming system for pulse coded data is provided in which the clock signals are extracted from the encoded data and first and second signals of the same amplitude and frequency but of different phase are generated from the clock signals. First and second amplifiers having variable gains provide amplification for the first and second signals, respectively. The first and second amplified signals are summed to produce a third signal having a phase which is a function of the relative amplitudes of the first and second amplified signals. The original pulse encoded data is sampled with the third signal to produce the retimed data output. The original pulse encoded data is also utilized to sample the third signal. The resulting signal is filtered to provide a DC voltage feedback error signal indicative of the phase difference between the third signal and the original pulse encoded data. This feedback signal is translated into a pair of complementary signals forming inputs to the first and second amplifiers, respectively, to vary the variable gains thereof, oppositely thereby adjusting the phase of the third signal to correspond to the phase of the original pulse encoded data.

10 Claims, 14 Drawing Figures

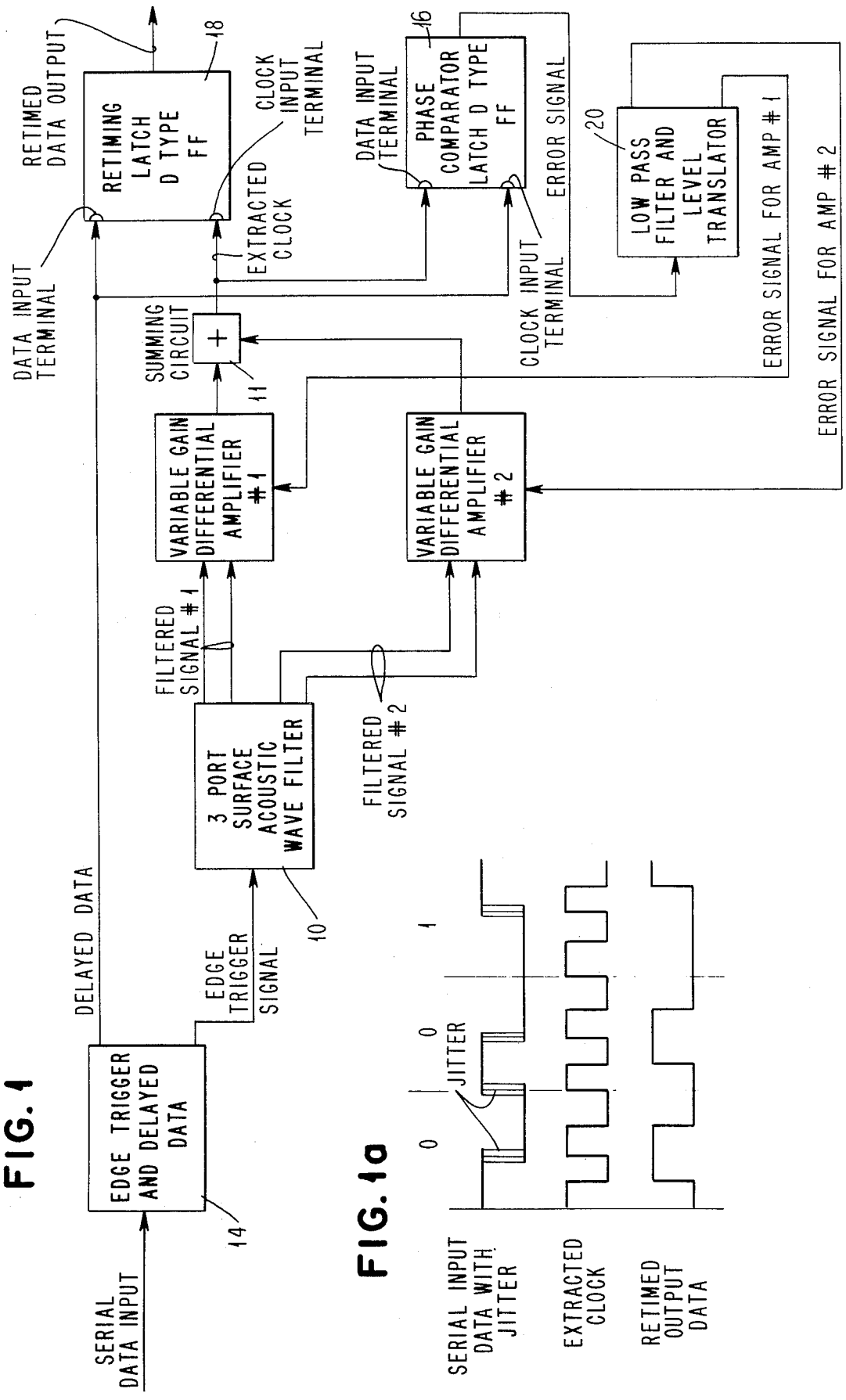

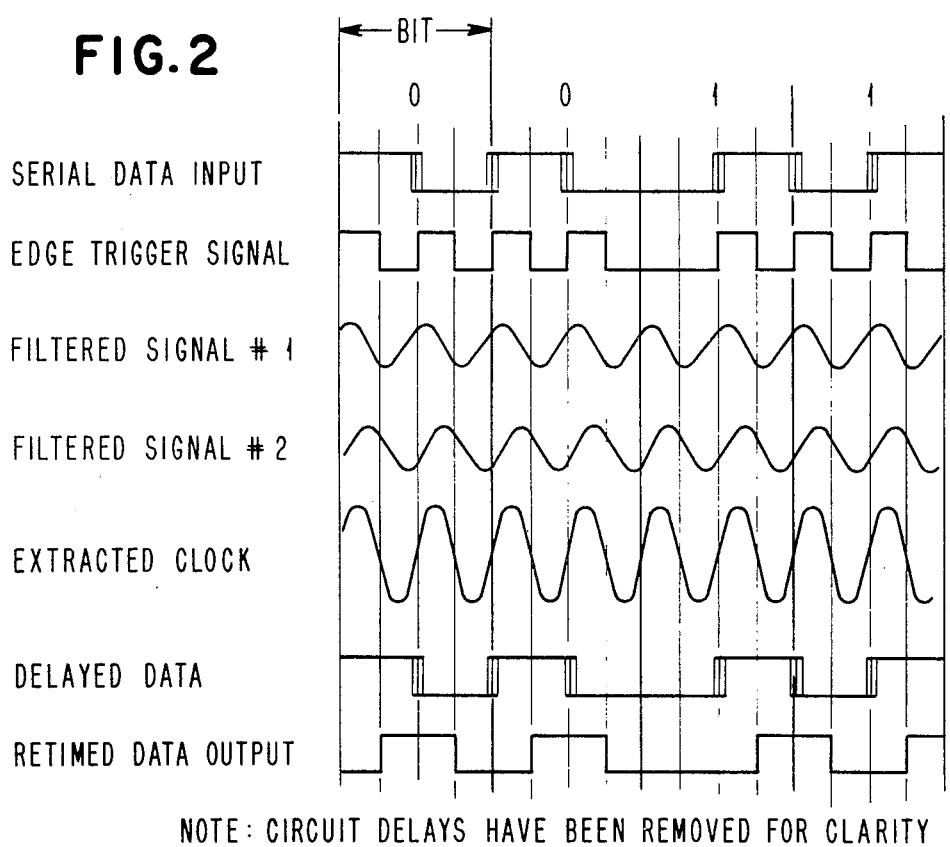
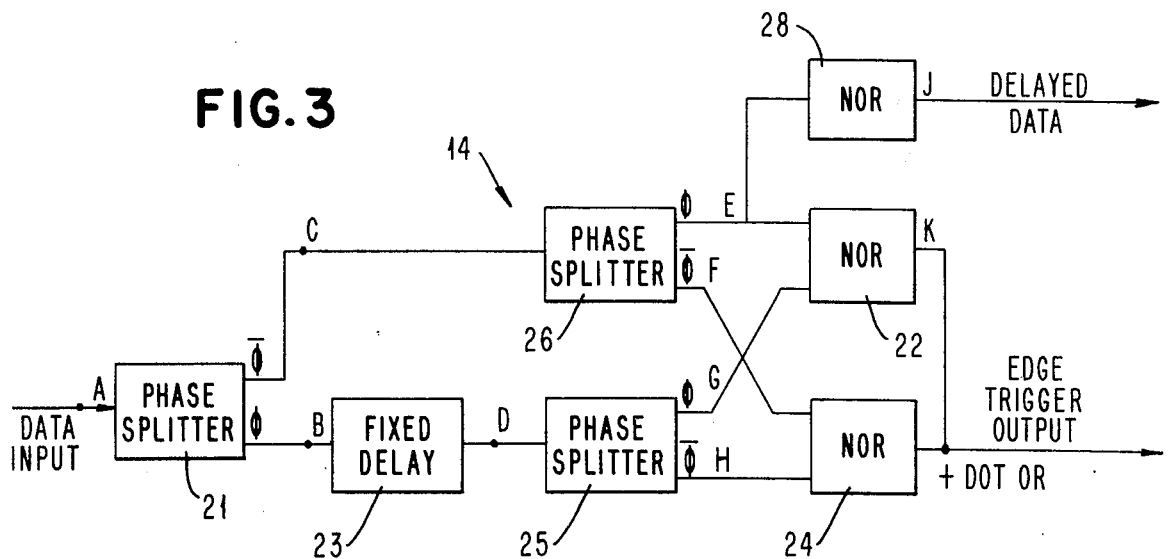

SERIAL PULSE-CODE-MODULATED RETIMING SYSTEM

BACKGROUND OF THE INVENTION

This invention relates to an improved retiming system for pulse coded data and, more particularly, to an improved synchronization system for extracting the clock signals and retiming the data using the extracted clock.

In data transmission systems wherein the data is in pulse-code-modulated form, it is customary to include repeaters in the system by which the data is reshaped, amplified and retimed. The retiming is generally accomplished by extracting the clock pulses from the incoming coded data. The extracted clock signal is filtered by a narrow band-width filter to reduce timing distortions. The extracted and filtered clock signal is then used to sample the original coded data and thus produce retimed serial PCM data. It is desirable to sample the coded data exactly midway between pulse transitions so as to allow the maximum distortion in the data signal without causing sampling errors. This is difficult to accomplish at high data rates due to manufacturing tolerances of the associated circuitry, and variations in these circuits with temperature changes, power supply drift and aging.

This invention applies the unique properties of a surface acoustic wave filter in a novel way to improve the sampling synchronization of a PCM retiming system. The arrangement can be fabricated by utilizing reliable low cost large scale integration techniques.

SUMMARY OF THE INVENTION

It is the main object of the present invention to provide a retiming system for pulse-code-modulated data in which the clock pulses are extracted from the data and adjusted to sample in the middle of the pulses in the data so that a high data rate can be utilized and accurate data retiming obtained.

It is another object of the present invention to provide a synchronization system for pulse-code-modulated data in which a three port acoustic surface wave device is utilized to provide a pair of signals having the same amplitude and frequency but out of phase by a predetermined amount.

It is another object of the present invention to provide a synchronization system in which a pair of amplifiers having variable gains are utilized in conjunction with a phasesumming arrangement to provide a phase adjusted clock signal.

It is a further object of the present invention to provide a synchronization system for pulse-code-modulated data in which the system is self-compensating for component aging, changes due to temperature variations, power supply drift and manufacturing tolerances.

Briefly, the invention consists of an improved retiming system for pulse-coded-data in which first and second signals of the same amplitude and frequency but of different phase are generated from the clock signals extracted from the encoded data. First and second amplyifing means having variable gain characteristics are utilized to amplify the first and second signals, respectively. The first and second amplified signals are summed to produce a third signal having a phase which is proportional to the relative amplitude of the first and second amplified signals. The original pulse encoded data is sampled by the generated third signal to produce retimed encoded data and the third signal is sampled by the original pulse encoded data to obtain a signal indicative of the phase difference between the third signal and the original pulse encoded data. This signal is filtered and translated into a pair of complementary feedback signals which form inputs to the first and second amplifiers, respectively, to vary the variable gains thereof oppositely, thereby adjusting the phase of the third signal to correspond to the phase of the original pulse encoded data.

BRIEF DESCRIPTION OF THE DRAWINGS

FIG. 1 is a functional block diagram of the serial pulse-code-modulated retiming system described by this invention.

FIG. 1a is a timing diagram showing the serial data input with jitter and the resulting retimed output data.

FIG. 2 is a timing diagram showing the waveforms generated in the retiming system of FIG. 1.

FIG. 3 is a logic block diagram of the edge trigger block shown in FIG. 1.

DESCRIPTION OF THE PREFERRED EMBODIMENT

General Description

Figure 3A:
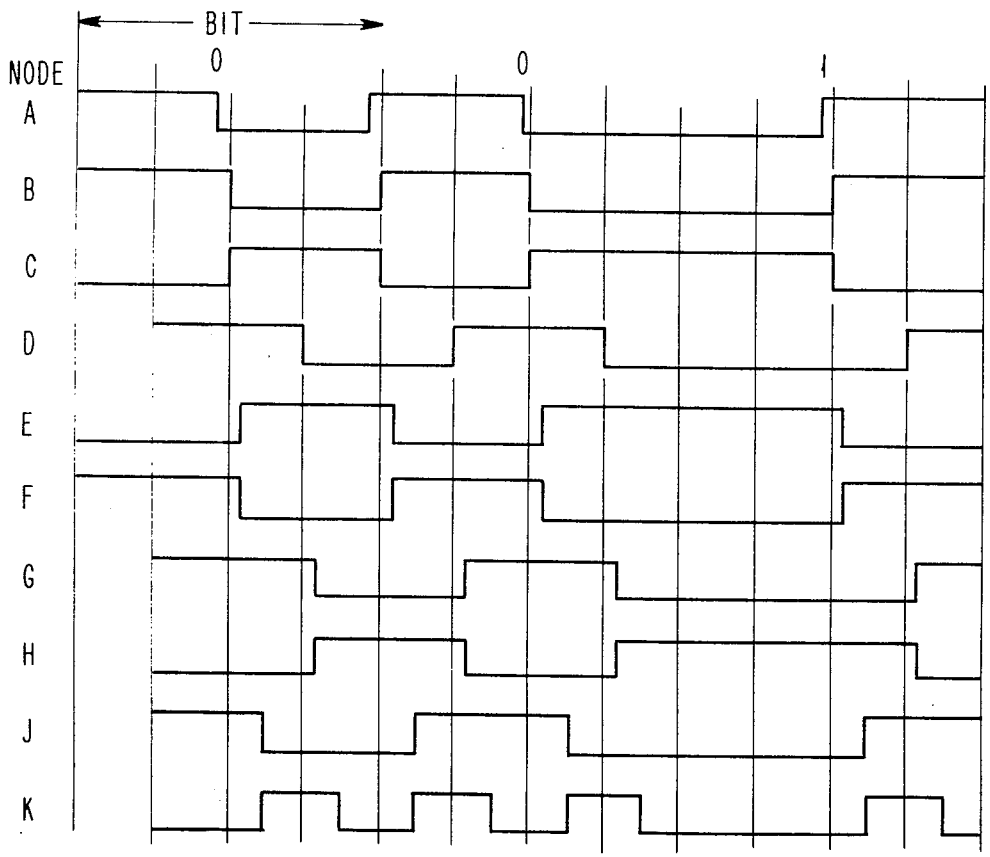
FIG. 3a is a timing diagram showing the waveforms associated with the various nodes shown in the edge trigger block diagram of FIG. 3.

Referring to FIG. 1, there is illustrated a block diagram of the serial pulse-code-modulated retiming system of the present invention incorporating therein the novel combination of the three port surface acoustic wave device 10, the variable gain amplifiers 1 and 2 and the summing circuit 11 for adjusting the phase of the clock signal so that it is in synchronism with the data bits of the received pulse-code-modulated signal. The PCM serial data input signal, illustrated in FIG. 2, is a binary phase encoded signal that contains a transition at the center of each bit and may or may not contain a transition at each bit boundary. As can be seen from FIG. 2 a "0" bit is represented by an up level followed by a down level while a "1" is represented by a down level followed by an up level. This serial data input signal is applied to an edge trigger circuit 14 which produces a pulse one quarter of a bit length long as a result of either a rising or falling transition of the input signal. The edge trigger 14 is composed of conventional logic circuits and a fixed delay line as is shown in FIG. 3. A delayed data output signal is also generated for use elsewhere in the network. It is identical to the input, but delayed by an amount equal to the delay in the edge trigger output.

Figure 4:
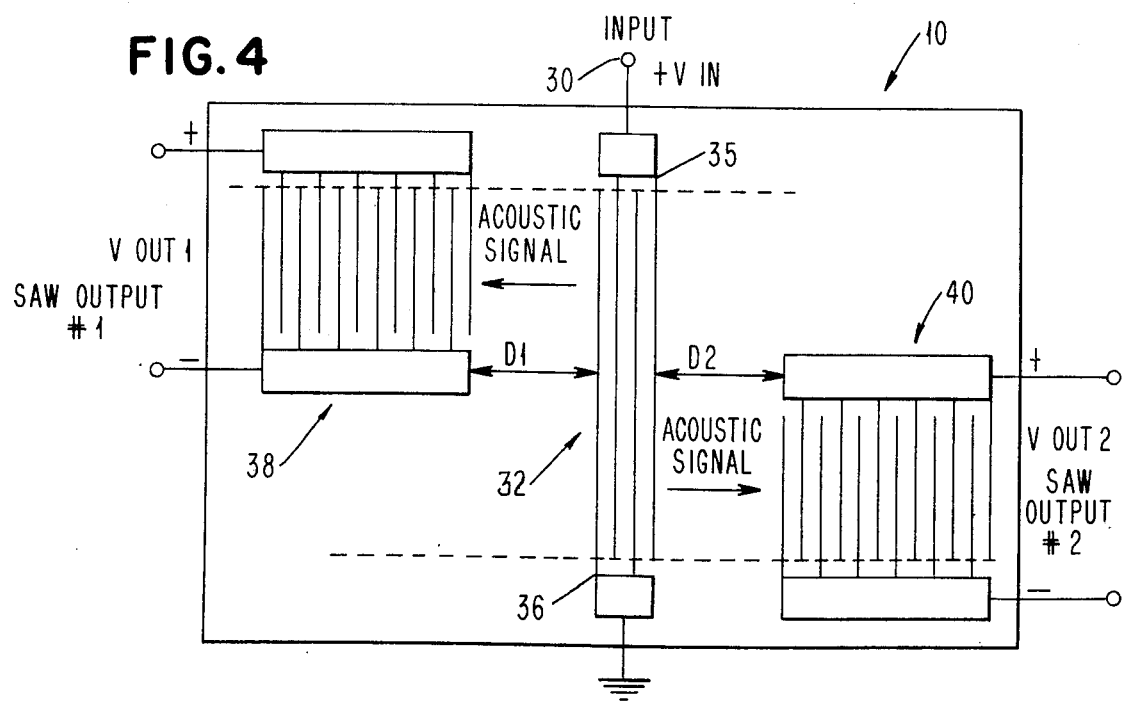
FIG. 4 is a schematic diagram of the three port surface acoustic wave filter shown in FIG. 1.
Figure 4A:
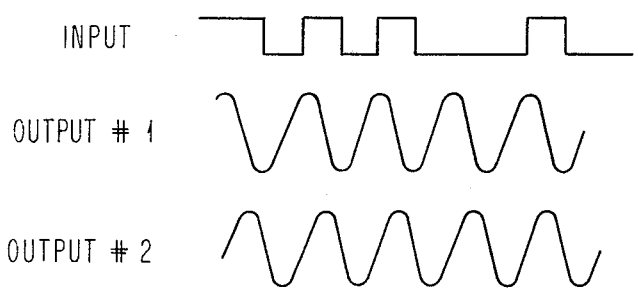
FIG. 4a is a timing diagram showing the various waveforms developed in the surface acoustic wave filter of FIG. 4.

The edge trigger output signal contains the original data clock frequency used to generate the PCM serial data signal. If the PCM serial input signal contains undesirable jitter (variations in the position of each transition from the ideal as shown in FIG. 1a), the edge trigger output and delayed data output will also contain this jitter. To reduce this jitter, the edge trigger output signal is applied to a narrow bandwidth surface acoustic wave filter resonant at the clock frequency. The filter will average the transition variations (jitter), dependent upon its bandwidth and the frequency of the variations, and extract the original clock signal with reduced jitter. The clock signal is to be used to sample the delayed data signal, twice per bit time, and thus retime the serial PCM data so as to obtain a reduction in jitter. The sampling of the delayed data signal is done precisely midway between transitions so as to minimize the probability of errors caused by excessive jitter. The positioning of the extracted clock signal relative to the delayed data signal is controlled by the design of the surface acoustic wave filter 10. FIG. 4 shows a schematic representation of a surface wave acoustic filter having a SAW output 1 and a SAW output 2. The input and output waveforms for the SAW filter 10 are shown in FIG. 4a. The phase of the output signals is a function of the distances $D_1$ and $D_2$ between the input transducer 32 and each output transducer 38 and 40. Due to the unique fabrication characteristics of SAW filters (photolithographic fabrication), these distances and thus the output phases are controllable and reproducible to a very high precision. The phase of the filter is, therefore, used to position the extracted clock signal nominally at the center of the delayed data signal. However, for high speed serial systems, the small variations in circuit delays as a result of manufacturing tolerances, environmental changes, long term aging, etc. may produce an undesirable skew between the extracted clock and the delayed data. To further reduce this skew, the output transducers 38 and 40 of the SAW filter 10 are constructed so as to produce signals which are 120° out of phase, see FIG. 4b. This is accomplished by the selection of distances $D_1$ and $D_2$, (FIG. 4). The two filtered clock signals SAW 1 and SAW 2 are then amplified by variable gain differential amplifiers 1 and 2, respectively, then summed to produce a resultant extracted clock signal with a phase somewhere between the two SAW filter output signals 1 and 2. The exact position of the resultant signal is controlled by varying the gain of each amplifier oppositely. This allows a large degree adjustment, approximately 120° on the position of the extracted clock. FIG. 5 shows a schematic of the two variable gain differential amplifiers with summed outputs. The gain is controlled by varying the voltage applied to the inputs labeled gain control input 1 and 2. The input signals for the gain controls are labeled error signals for amplifier 1 and 2, in FIG. 1, and are generated by the phase-comparator latch 16.

Figure 6:
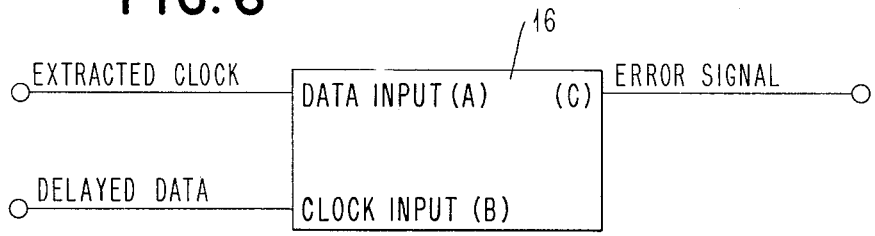
FIGS. 6 and 6a are, respectively, a block diagram of the phase comparator latch and a timing diagram showing the inputs to the input terminals and the resulting output therefrom.
Figure 6A:
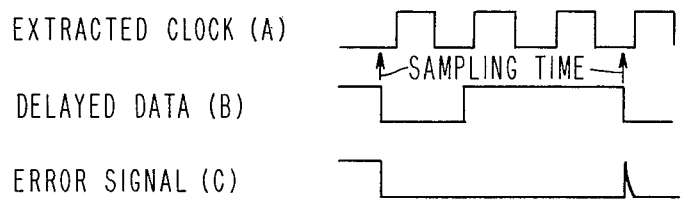

FIG. 6 demonstrates the operation of the phase-comparator latch 16 which is a D type flip-flop implemented with conventional current-switch emitter-follower logic and is identical to the retiming latch 18. The delayed data signal is applied to the clock input terminal B of the latch 16 and the extracted clock signal is applied to the data input terminal A. Thus, the falling transition of the delayed data is used as the timing signal for the latch 16 to sample the extracted clock signal. When the delayed data and extracted clock signal are synchronized, the latch 16 samples on a transition of the extracted clock signal. If the extracted clock is early, the latch samples an up state. If the extracted clock is late the latch samples a down state. This operation is demonstrated by the waveforms of FIG. 6a, when the delayed data samples the clock. Thus, the phase-comparator generates an error signal, the polarity of which indicates the relative position of the delayed data and extracted clock. The error signal generated by the phase-comparator 16 is integrated by a low pass filter 46 and complementary signals are produced by the level translator shown in FIG. 7. The complementary signals are the error signals for oppositely varying the gain of amplifiers 1 and 2. With the extracted clock and delayed data signals properly aligned, they are fed into the retiming latch 18. The extracted clock signal enters the clock input terminal and the delayed data enters the data input terminal of the retiming latch 18 causing the falling transition of the extracted clock to sample the delayed data. The output of the retiming latch 18 is the retimed serial PCM data with the jitter reduced. The clock has been adjusted to sample in the middle of each data pulse excursion.

The retiming latch is a well known latch circuit which consists of a flip-flop circuit which samples the data input for each falling clock transition to get the retimed data. Waveforms representing the extracted clock, the delayed data and the retimed data ouput are shown in FIG. 2.

Edge Trigger and Delayed Data Circuit (FIG. 3)

The data input to the edge trigger circuit 14 is shown as waveform node A in FIG. 3a which corresponds to node A in FIG. 3. The waveforms A thru K of FIG. 3a are located by the identical letters in FIG. 3. The input data A enters phase splitter 21 which produces output signals B and C of opposite phase at nodes B and C. The signals at node B pass thru fixed delay 23 resulting in the delayed signals at node D. These delayed signals D pass thru phase splitter 25 to produce out-of-phase signals G and H. It should be noted that signals G go to NOR circuit 22 and signals H go to NOR circuit 24. Signals C are connected as the input to phase splitter 26 which produces signals E and F of opposite polarity. The signals E and G from phase splitters 26 and 25, respectively, of the same polarity go to NOR circuit 22 which produces output signals K having a duration which corresponds to the portion of E and G which are simultaneously at the same down level. Similarly, the opposite polarity signals F and H go to NOR circuit 24 which produces an output signal K as long as signals F and H are at the same down level. It should be appreciated that when signals E and G are of the same level that F and H are of the same level but opposite to the level of E and G. The output of NOR circuits 22 and 24 are dot OR'd together to get the edge trigger output from NOR circuits 22 and 24. Actually the edge trigger and delayed data circuit 14 produces a pulse for each transition of the input data, which has a duration as determined by the fixed delay. The duration is set to be about half a pulse width and is therefore about a quarter of a bit in width. The output of E of phase splitter 26 goes to NOR 28 which results in output J which is a replica of the input data with a small delay.

Three Port Surface Acoustic Wave Filter (FIG. 4)

The acoustic surface wave device 10 receives the edge trigger signals from edge trigger circuit 14 at the input terminal 30 (FIG. 4) and sets up a corresponding acoustic wave in the piezoelectric material upon which the transducers are formed. The transmitting element sometimes referred to as the input transducer 32 is formed of a first comb like structure 35 having a predetermined number of teeth and a second comb 36 of equal number of teeth interlaced with the teeth of the first comb. The input transducer 32 causes an acoustic wave to be set up on the surface of the piezoelectric material which travels in opposite directions therefrom towards the receiving transducers 38 and 40. This acoustic wave sets up an electrical signal of equal amplitudes and frequency in elements 38 and 40. However, the phase of the received signals are determined by the distance between the transmitting element 32 and the receiving elements 38 and 40 represented in FIG. 4 as $D_1$ and $D_2$. The receiving elements 38 and 40 are each made of a first and second comb like structure having the same predetermined number of teeth each of which are interlaced with the other. The outputs of the receiving transducers 38 and 40 are designated as SAW output 1 and SAW output 2, respectively.

Figure 4B:
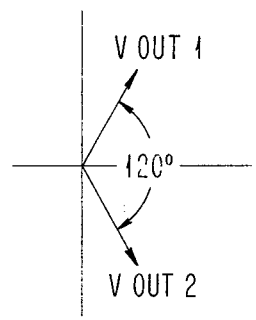
FIG. 4b is a vector diagram showing in vector form the output of the acoustic surface wave device.
Figure 5:
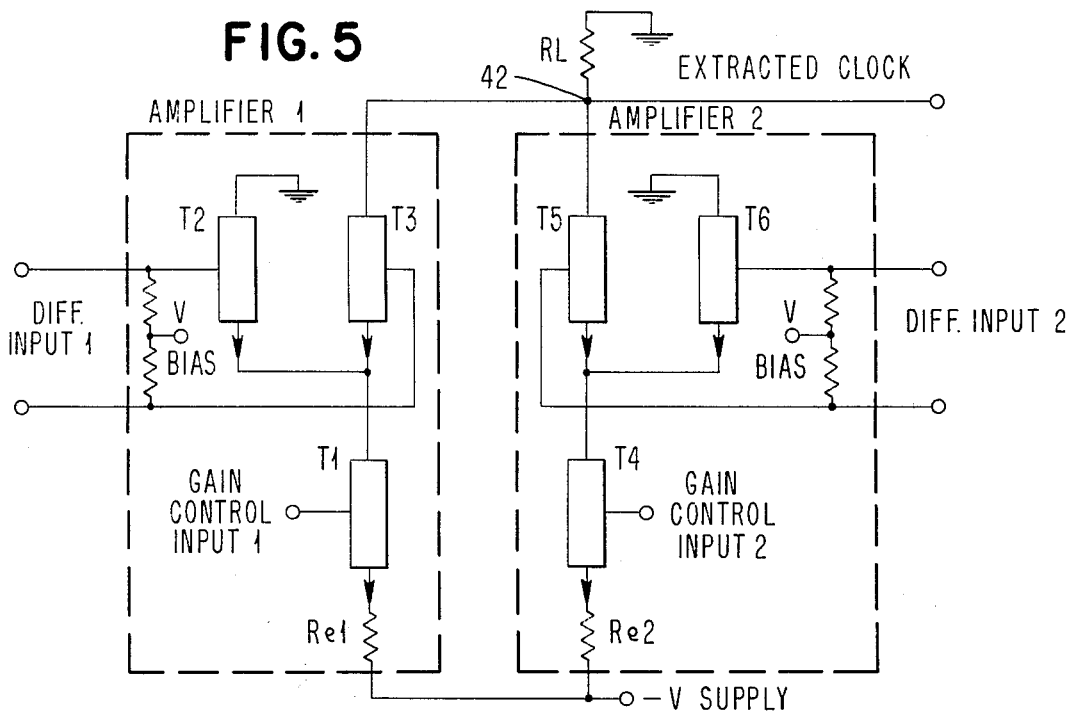
FIG. 5 is a schematic diagram of the variable gain differential amplifiers and summing circuit shown in block form in FIG. 1.

Referring to timing diagram FIG. 4a and vector diagram FIG 4b there is shown the timing waveform input which is applied to input 30. This waveform creates the previously mentioned acoustic signal which results in SAW output 1 and SAW output 2 which, as can be seen from FIG. 4a, are 120° out of phase. The difference in phase is better represented in the vector diagram of FIG. 4b. As shown, the SAW output 1 and SAW output 2 signals are of equal amplitude and frequency but out of phase as shown. As previously mentioned, the phase is determined by the distance between the transmitting element 32 and the receiving elements 38 and 40, respectively. The transmitting element 32 and receiving elements 38 and 40 can be arranged in several other positions to give the same results. For example, the receive elements 38 and 40 could both be located on the same side with respect to the transmitting element 32. The distances $D_1$ and $D_2$ would still provide the relative phases.

Variable Gain Differential Amplifiers With Summing Circuit (FIG. 5)

FIG. 5 shows a pair of variable gain differential amplifiers 1 and 2. Each amplifier consists of an emitter-coupled-amplifier, the output of which is tied to the output of the This output other emitter-coupled-amplifier. Each of the amplifiers 1 and 2 are the same and amplifier 1, for example, consists of transistors T1, T2 and T3. The filtered signal 1 from the three port surface acoustic wave filter 10 serves as the input to the amplifier and has each of the polarities of the input signal connected to the appropriate base of T2 and T3. This biasing controls the current flow through the load resistor RL. However, transistor T1 and resistor RE1 implement a current source that is controlled by the voltage applied to the gain control input 1. The current flowing through T2 and T3 is controlled by the AC signal applied to the differential input 1. The output signal is across RL. The magnitude of the signal is a function of the current source combination of T1 and RE1. Thus, the gain of the amplifier is controlled by the DC voltage applied at the base of T1. This gain control input is obtained as an error signal for amplifier 1 as shown in FIG. 1 and previously described.

Figure 5A:
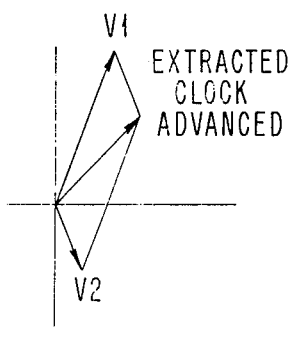
FIGS. 5a and 5b are vector diagrams showing an example of the extracted clock advanced and retarded, respectively, at the output of the summing circuit.
Figure 5B:
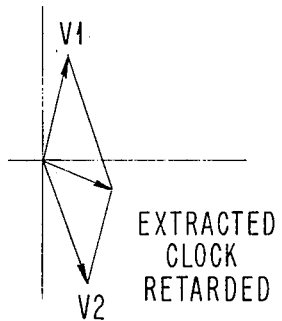

Referring to FIG. 5a there is shown a vector diagram representing the amplitude and direction of the outputs of the variable gain differential amplifier 1 and variable gain differential amplifier 2 represented as vectors V1 and V2, respectively. The vector diagram shows vector V1 as having a relatively large amplitude and at approximately a 60° angle with the abscissa. The vector V2 is much smaller in amplitude and makes a 60° negative angle with the abscissa if we consider the counter clockwise direction from the abscissa as being positive. The resultant vector of V1 and V2 is shown in FIG. 5a and is identified as extracted clock advanced. This vector diagram indicates that for the given V1 and V2 the extracted clock is actually the summation of the two outputs from the variable gain differential amplifier 1 and 2. The diagram shows that for a large V1 and a small V2 the extracted clock will be advanced. It will be appreciated that equal vectors V1 and V2 having equal but opposite polarity angles will produce a resultant which lies along the abscissa. Now referring to FIG. 5b, vectors V1 and V2 are shown with V2 being larger than V1 and having equal but opposite polarity angles. The resultant vector is shown lying below the abscissa which indicates the extracted clock is retarded. The summing circuit, as shown in FIG. 1, is actually the dot ORing of the two outputs of amplifier 1 and amplifier 2 together at 42, as shown in FIG. 5. The resultant vector or summation is obtained across resistor RL to ground.

Figure 7:
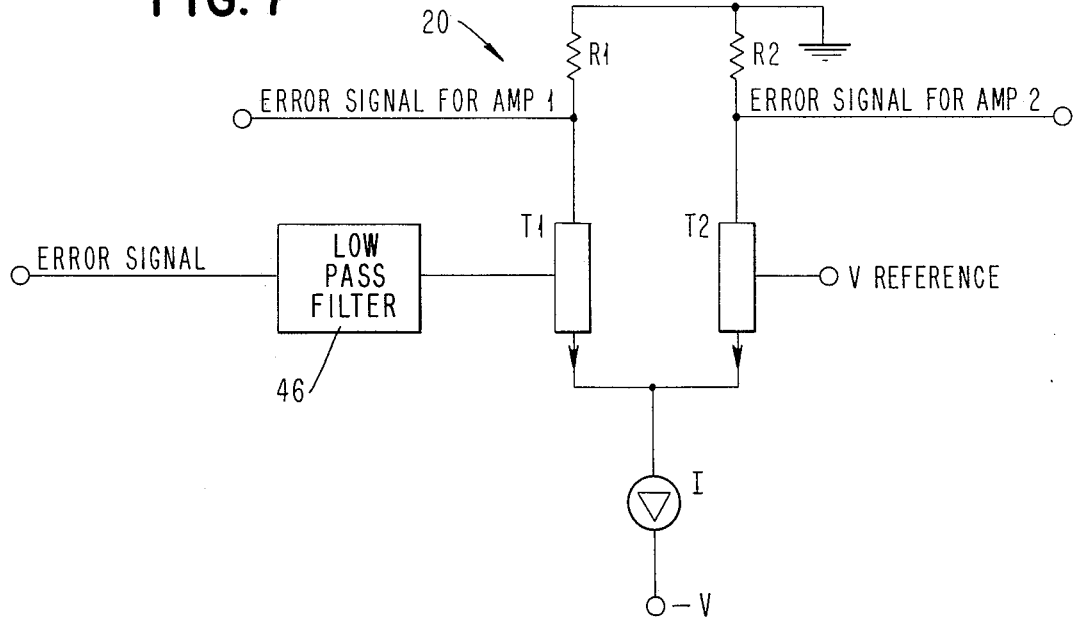
FIG. 7 is a schematic diagram showing the low pass filter and level translator block of FIG. 1 in more detail.

Low Pass Filter and Level Translator (FIG. 7)

As was previously explained and as can be seen from FIG. 1, the error signal generated by the phase-comparator latch 16 is sent to a low pass filter and level translator 20. The low pass filter 46 shown in FIG. 7 receives the error signal and essentially performs an integration on the input error signals. Consequently, the low pass filter is a well known RC network and will not be described in any further detail. The output of the low pass filter 46 is a slowly varying signal which is applied to the base of transistor T1. This input to transistor T1 along with a voltage reference input applied to the base of transistor T2 controls the current flow through T1 and T2. The collective voltages generated across R1 and R2 will be out of phase by 180° and constitute the error signal for the amplifier 1 taken across R1 and the error signal for amplifier 2 taken across R2. The level translator converts the signals from the low pass filter into two signals of opposite polarity to form the required error signals for amplifiers 1 and 2. As was previously described, these error signals were applied to variable gain differential amplifiers 1 and 2, respectively, to control the gains thereof. It should be noted that the gains of amplifiers 1 and 2 are varied oppositely in response to the 180° or polarity difference between the signals generated by the level translator.

It should be appreciated that the outputs of the variable gain differential amplifiers 1 and 2 are some function of the difference in phase between the delayed data and extracted clock. The two signals after summing provide a phase adjustment to the extracted clock so that it is positioned with respect to the delayed data to essentially eliminate the phase difference determined in phase-comparator 16. Thus, the feedback to vary the gain of the differential amplifiers is such as to correct the position of the extracted clock with respect to the data to eliminate the feedback correction. Actually, the correction adjusts the extracted clock so that its samples right in the middle of the delayed data so that the jitter or interference on the delayed data pulses does not interfere with the obtaining of the retimed data via retiming latch 18.

While the invention has been particularly shown and described with reference to the embodiment thereof, it will be understood by those skilled in the art that the foregoing and other changes in form and detail may be made therein without departing from the spirit and scope of the invention.

What is claimed is:

1. An improved clock retiming system for pulse-coded data comprising;
   edge trigger and delayed data means for extracting clock signals from and delaying said encoded data;
   filter means connected to said edge trigger and delayed data means for generating from said extracted clock signals first and second signals of the same amplitude nd frequency but of different phase;
   first and second amplifying means connected to said filter means for amplifying said first and second signals, respectively, said first and second amplifying means each having the same variable gain characteristics;
   summing means connected to said first and second amplifying means for summing said first and second amplified signals to produce a third signal having a phase which is a function of the relative amplitudes of said first and second amplified signals;
   first sampling means connected to said summing means and said edge trigger and delayed data means for sampling said delayed pulse encoded data with said third signal to obtain the retimed encoded data;
   second sampling and phase comparator means connected to said summing circuit and said edge trigger and delayed data means for sampling said third signal with said delayed pulse encoded data to obtain an error signal, the polarity of which indicates the relative phase of said third signal and said delayed pulse encoded data;
   further filter and translating means connected to said second sampling and phase comparator means for filtering and translating said error signal into a pair of opposite phase error signals, one forming an input to said first amplifying means and the other forming an input to said second amplifying means to vary the respective variable gains thereof oppositely, thereby adjusting the phase of said third signal by means of said summing means to position said third signal to sample said encoded data.

2. An improved clock retiming system according to claim 1, wherein said filter means for generating first and second signals of the same frequency but of different phase comprises an acoustic surface wave device having an input transducer connected to receive extracted clock signals from said edge trigger and delayed data means, and having a pair of output transducers located to receive surface wave acoustic signals from said input transducer and arranged to provide output signals having the same frequency as said input clock signals and having equal amplitudes but of different phases.

3. An improved clock retiming system according to claim 2, wherein said input and output transducers each comprise a first and second group of spaced apart fingers with the fingers of the first and second group interlaced with one another, the fingers being spaced to provide a frequency response equal to the frequency of the extracted clock signal inputs thereto.

4. An improved clock retiming system according to claim 2, wherein said pair of output transducers are arranged with respect to said input transducer to give a pair of output signals of the same amplitude but of different relative phases.

5. An improved clock synchronization system according to claim 4, wherein said pair of output transducers are spaced from said input transducer so as to give 120° relative phase shift between said pair of output signals from said pair of output transducers.

6. An improved clock retiming system according to claim 1, wherein said edge trigger and delayed data means for extracting clock signals from said encoded data consists of an edge trigger circuit which generates a pulse of a given duration at each positive and negative excursion of the incoming pulse-coded data.

7. An improved clock retiming system according to claim 1, wherein said first and second amplifying means each include an emitter-coupled-amplifier, whose outputs are tied together to give the phase summation of the outputs, the gain of the respective first and second amplifying means being individually variable in accordance with control voltage inputs to obtain a proportional phase displacement.

8. An improved clock retiming system according to claim 1, wherein said first sampling means for sampling said delayed pulse encoded data with said third signal includes a sample and hold latch which provides a positive pulse output upon the fall time of the third pulse when the data pulse is up and drops the positive output at the fall time of the third pulse when the data is down.

9. An improved clock retiming system according to claim 1, wherein said second sampling and phase comparator means for sampling said third signal with said delayed pulse encoded data includes a sampling latch and hold circuit which is triggered by the falling transition of each data pulse to produce an up or down error pulse output dependent upon the up or down condition of said third pulse extracted clock at the sampling time.

10. An improved clock retiming system according to claim 9, wherein said error pulse output from said second sampling and phase comparator means is fed to a low pass filter and level translator which essentially integrates the waveform and translates it into two feedback signals 180° out of phase which provide the opposite bias to vary the gains of said first and second amplifying means.

* * * * *